United States Patent
Motoyama

(10) Patent No.: US 6,441,489 B1
(45) Date of Patent: Aug. 27, 2002

(54) SEMICONDUCTOR DEVICE WITH TANTALUM NITRIDE BARRIER FILM

(75) Inventor: Kouichi Motoyama, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/533,247

(22) Filed: Mar. 22, 2000

(30) Foreign Application Priority Data

Mar. 23, 1999 (JP) .......................................... 11-077698

(51) Int. Cl.⁷ .............................................. H01L 23/52
(52) U.S. Cl. ...................... 257/751; 257/741; 257/750; 257/774
(58) Field of Search ................. 257/774, 751, 257/750, 741

(56) References Cited

U.S. PATENT DOCUMENTS 6,100,195 A * 8/2000 Chan et al. ................. 438/687

FOREIGN PATENT DOCUMENTS

| JP | 7-130849 | 5/1995 |
|---|---|---|
| JP | 9-17790 | 1/1997 |
| JP | 10-12617 | 1/1998 |
| JP | 10-79388 | 3/1998 |
| JP | 10-2442271 | 9/1998 |
| JP | 10-275859 | 10/1998 |
| JP | 11-354464 | 12/1999 |
| JP | 2000-124310 | 4/2000 |

\* cited by examiner

*Primary Examiner*—Roy Potter
(74) *Attorney, Agent, or Firm*—Sughrue Mion, PLLC

(57) ABSTRACT

A semiconductor device having a copper interconnect filled in the inter-layer insulating film 4 composed of at least SiOF, via a barrier film 7. In the semiconductor device, the barrier film is composed of tantalum nitride containing 30 to 60% of nitrogen, in order to suppress the film peeling which may occur in the CMP step after the annealing conducted for reducing the resistivity of copper film.

8 Claims, 5 Drawing Sheets

Anneal
+
CMP

Anneal + CMP

Anneal + CMP

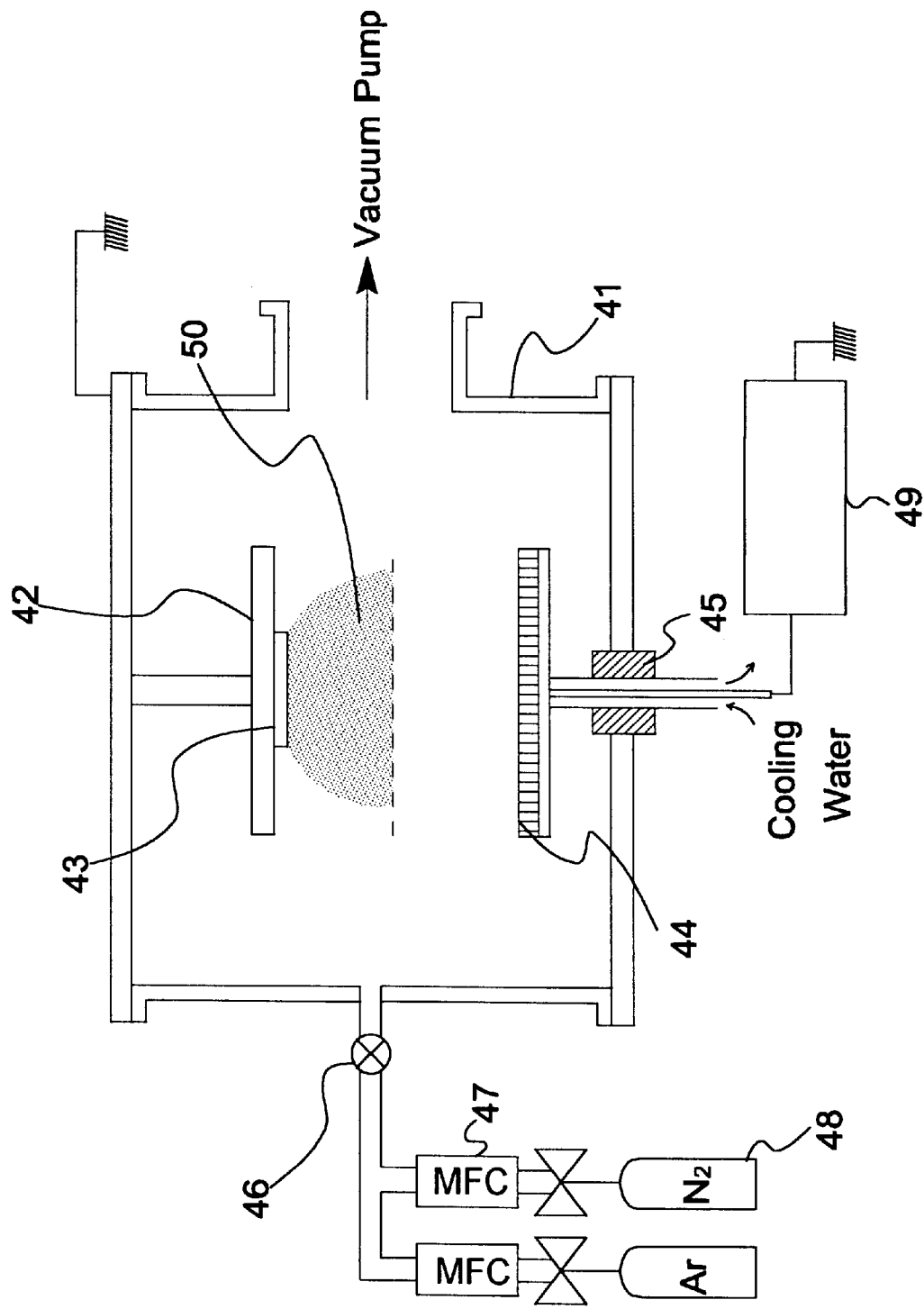

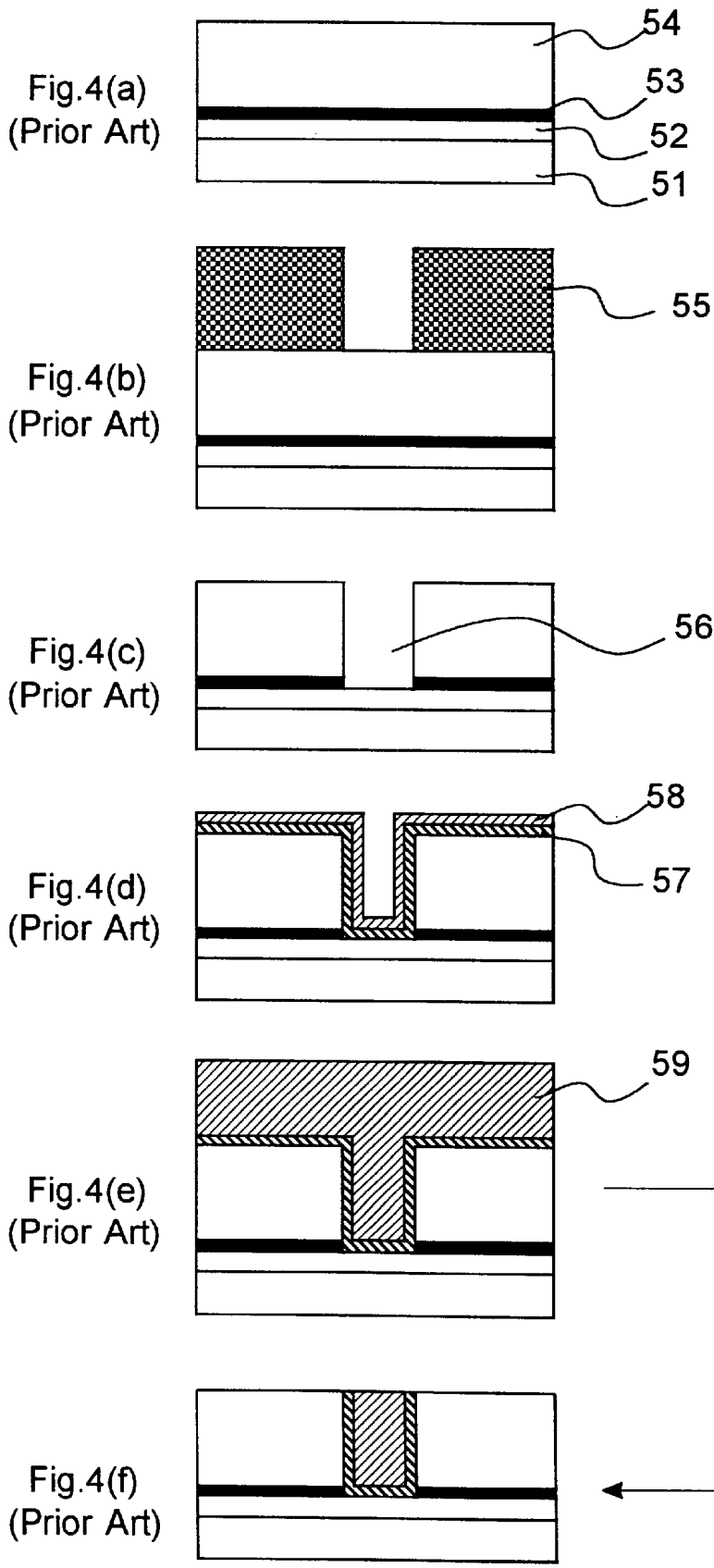

SEMICONDUCTOR DEVICE WITH TANTALUM NITRIDE BARRIER FILM

BACKGROUND OF THE INVENTION

1. Field of the Invention

The present invention relates to a semiconductor device and a method for production thereof. More particularly, the present invention relates to a semiconductor device having a copper interconnect and a method for production thereof.

2. Description of the Related Art

In recent years, as the circuit of semiconductor apparatus has become finer and more highly integrated, the interconnect thereof has become increasingly finer and more multi-layered. As the material for the interconnect, aluminum or an alloy thereof has been used widely. With these materials, heat generation and larger power consumption have become striking in association with the increased fineness and integration of interconnect; as a countermeasure therefor, it was proposed to use, as the material for interconnect, copper which has a lower resistance than aluminum, and copper is already in practical use partially.

In forming an aluminum interconnect, an aluminum layer is formed, it is subjected to dry etching to form an aluminum interconnect pattern, and an inter-layer insulating film is formed thereon to bury the aluminum interconnect in the insulating film. In forming a copper interconnect, however, patterning by dry etching is difficult; therefore, an inter-layer insulating film is formed first, a trench is formed therein, copper is filled in the trench to form a copper interconnect (this method is called damascene method).

When copper has been filled in the trench formed in an inter-layer insulating film, to form a copper interconnect, it occurs that copper diffuses and the devices (e.g. transistor) formed on a substrate are adversely affected. To prevent this phenomenon, a thin barrier film capable of preventing the diffusion of copper is ordinarily formed in the trench before the formation of a copper interconnect.

Various films have been investigated as the thin barrier film. A tantalum-based barrier film is promising from the standpoints of the barrier property and the adhesivity with copper.

It is disclosed in JP-A-9-17790 that the problem of copper diffusion during annealing of 500° C. can be solved by, in forming a copper interconnect filled in an inter-layer insulating film, forming, as a barrier film between $SiO_2$ (which is an inter-layer insulating film) and copper (which is a interconnect), a TaN (hexagonal system phase) layer or a TaN (hexagonal system phase)-Ta (α phase) multilayer.

The conventional steps for forming a copper interconnect is described below with reference to FIG. 4.

First, as shown in FIG. 4(a), a $SiO_2$ insulating film 52 is formed on a silicon substrate 51 wherein a transistor region (not shown) and a contact (not shown) have been formed; successively, an etching stopper film 53 composed of SiN, SiON or the like is formed in a thickness of about 50 nm; then, an inter-layer insulating film 54 composed of $SiO_2$ (in which a trench for filling copper therein is to be made) is formed in a thickness of about 400 nm. Thereon is coated a photoresist, followed by light exposure and development to leave a photoresist mask 55 [FIG. 4(b)]. Using this mask, the inter-layer insulating film 54 is subjected to etching to form a trench 56 such as shown in FIG. 4(c).

Next, the substrate in which a trench pattern has been formed as above, is placed in a sputtering apparatus. First, a Ta-based barrier film 57 composed of, Ta, TaN or the like is formed in a thickness of about 30 nm and then a Cu sputtering film 58 is formed in a thickness of about 100 nm by sputtering [FIG. 4(d)].

Successively, a Cu plating film 59 is formed in a thickness of 800 nm by electrolytic plating or the like [FIG. 4(e)]. The Cu plating film 59 formed by electrolytic plating has a resistivity of 2.4 $\mu\Omega$.cm (20° C.) slightly higher than that [1.72 $\mu\Omega$.cm (20°C.)] of bulk copper and, moreover, owing to the small particle diameters, has lower resistance to electron migration (EM). It is known that application of an annealing treatment at about 250 to 400° C. can reduce the resistivity to about 1.9 $\mu\Omega$.cm (20° C.) and further brings about growth of particles and resultant increase in EM resistance.

Thereafter, chemical mechanical polishing (CMP) is conducted until the surface of the inter-layer insulating film 54 is exposed, whereby copper can be filled in the trench as shown in FIG. 4(f).

$SiO_2$ is ordinarily used as the material for inter-layer insulating film. An inter-layer insulating film of low dielectric constant is required in logic type semiconductor devices because the shortening of delay in signal transmission is essential in such devices. Therefore, it is under investigation to form an inter-layer insulating film of low dielectric constant, composed of SiOF ($\in\approx 3.3$), by using a high-density plasma CVD apparatus (HDP-CVD) and feeding a fluorine-containing gas thereinto.

It is described in JP-A-10-275859 that when a TiN anti-reflection film formed on an Al interconnect or the like is covered with a SiOF film to fill the interconnect therein, peeling appears between the TiN film and the SiOF film. It is further described that the problem can be solved by forming a thin silicon oxide film by sputtering or by plasma CVD and then forming a SiOF film thereon.

The present inventor found out that, in forming a SiOF inter-layer insulating film, forming a Ta-based barrier film, forming a Cu plating film, conducting annealing and then conducting CMP, similar peeling takes place between the barrier film and the SiOF inter-layer insulating film owing to the load applied during CMP. No peeling occurred when no annealing was conducted before CMP.

When the inter-layer insulating film is composed of $SiO_2$, annealing is known to improve adhesivity between barrier film and inter-layer insulating film; therefore, annealing has been conducted positively. It has not been known that when the inter-layer insulating film is composed of SiOF, annealing reduces its adhesivity with a Ta-based barrier film. This problem offers a novel task.

It is considered to, as described in the above literature, interpose a $SiO_2$ film between a barrier film and a SiOF film for adhesivity improvement. This approach is not practical because it invites an increased dielectric constant (the meaning of using a SiOF film is negated) and complicated steps.

SUMMARY OF THE INVENTION

The object of the present invention is to provide a semiconductor device having a copper interconnect filled in the inter-layer insulating film composed of SiOF, wherein the adhesion between the inter-layer insulating film and the barrier film is improved for higher reliability of interconnect and the whole inter-layer insulating film has a low dielectric constant for smaller capacity between interconnects and higher-speed operation of device; and a method for producing such a semiconductor device.

To achieve the above object, the present invention provides a semiconductor device having a copper interconnect filled in a trench of an inter-layer insulating film composed of at least SiOF, via a barrier film, wherein the barrier film is composed of tantalum nitride containing 30 to 60%, particularly 40 to 60% of nitrogen.

In the semiconductor device of the present invention, the barrier film preferably has a thickness of 5 to 60 nm, and the copper interconnect preferably has a resistivity of 2 $\mu\Omega$.cm or less at 20° C.

According to the present invention, there is also provided a method for producing a semiconductor device having a copper interconnect filled in a trench of an inter-layer insulating film composed of at least SiOF, via a barrier film, which process comprises:

a step of forming an inter-layer insulating film composed of SiOF, a step of forming a trench in the inter-layer insulating film, a step of forming, on the whole surface of the inter-layer insulating film including the trench surface, a barrier film composed of tantalum nitride containing nitrogen in an amount of 30 to 60%, a step of forming a copper film on the barrier film, a step of annealing the resulting material at 250 to 400° C., and a step of polishing the copper film and the barrier film by chemical mechanical polishing until the surface of the inter-layer insulating film is exposed, to form a copper interconnect in the trench.

In the above method, the barrier film is formed by reactive sputtering and, in the sputtering, a mixed gas of argon and nitrogen is fed into the sputtering space and the nitrogen flow amount ratio in the mixed gas flow amount is controlled at a level necessary and sufficient to obtain tantalum nitride of said nitrogen content. The nitrogen flow ratio is preferably controlled at 15 to 40% when a sputtering apparatus with a collimator is used and at 30 to 60% when a sputtering apparatus with no collimator is used.

According to the present invention, a tantalum nitride barrier film of controlled nitrogen content is formed, whereby the adhesivity between SiOF inter-layer insulating film and barrier film is improved even though an annealing treatment (conducted for reduction in resistivity of copper interconnect and increase in EM resistance of copper interconnect) is conducted before CMP. Therefore, there is provided a semiconductor device wherein the reliability of interconnect is improved, the whole inter-layer instlating film has a low dielectric constant and the capacity between interconnects is small, and which enables high-speed operation.

BRIEF DESCRIPTION OF THE DRAWINGS

FIG. 3 is a schematic view showing an example of the structure of the sputtering apparatus used in formation of the barrier film of the present invention.

FIGS. 4(a) to 4(f) are sectional views showing the steps of a conventional method for production of copper interconnect.

DETAILED DESCRIPTION OF THE PREFERRED EMBODIMENTS

The embodiments of the present invention are described below.

FIGS. 1(a) to 1(f) are sectional views showing the first embodiment of the present invention stepwise. In this embodiment, a case is described in which a copper interconnect is formed as the first interconnect.

Figure 1A:
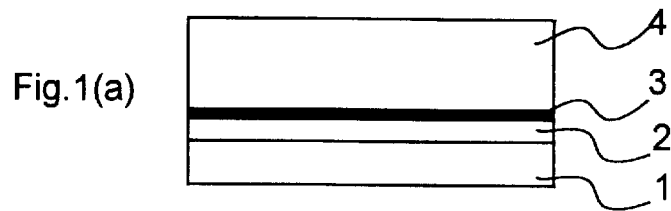
FIGS. 1(a) to 1(f) are sectional views showing the steps of an embodiment of the method of the present invention.
Figure 1B:
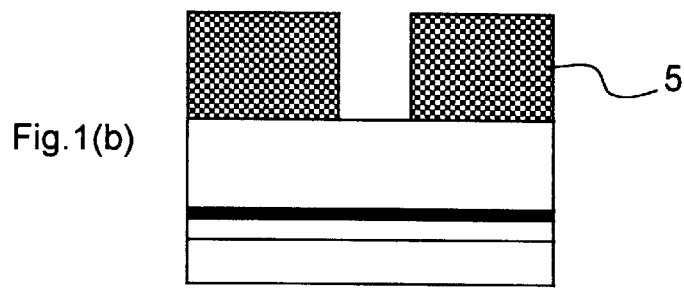

As shown in FIG. 1(a), a $SiO_2$ insulating film 2 is formed on a silicon substrate 1 wherein a transistor region (not shown) and a contact (not shown) have been formed.

Figure 1C:
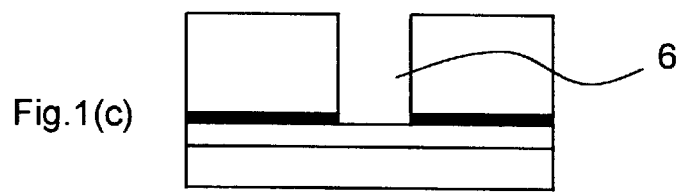
Figure 1D:
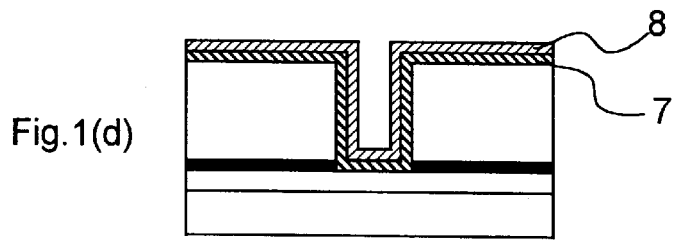

Successively, an etching stopper film 3 composed of SiN, SiON or the like is formed in a thickness of about 50 nm. Then, an inter-layer insulating film 4 composed of SiOF (a trench is later formed therein, for filling of copper in the trench) is formed in a thickness of about 400 nm. This SiOF film 4 is grown by feeding, into an ordinary parallel plate PE-CVD apparatus, TEOS or a $SiH_4$ type gas, a fluorine-based gas (e.g. $C_2F_6$ or TEFS), oxygen and helium. When TEOS and $C_2F_6$ are used, the fluorine concentration in SiOF film is controlled at 5 to 10 atom % by the film formation power, temperature, flow amount ratio of each raw material gas, etc. used. Specifically, TEOS gas is controlled at 50 to 200 SCCM, $C_2F_6$ gas at 300 to 600 SCCM, oxygen at 500 to 2,000 SCCM, RF power at 800 to 1,000 W and substrate temperature at 300 to 400° C. By controlling the flow amount of each raw material, the fluorine concentration in SiOF film can be controlled as desired; however, the fluorine concentration in SiOF film is controlled preferably at 8 atom % or less and is required to be 1 atom % or more for securing a low dielectric constant. Thereon is coated a photoresist, followed by light exposure and development to leave a resist mask 5 [FIG. 1(b)]. Using this mask, the inter-layer insulating film 4 is subjected to etching to form a trench 6 such as shown in FIG. 1(c).

The above-obtained substrate having a trench pattern formed thereon is placed in a sputtering apparatus. First, Ta-based barrier film 7 composed of Ta, TaN or the like is formed in a thickness of about 30 nm; then, a Cu sputtering film 8 is formed in a thickness of about 100 nm by sputtering [FIG. 1(d)].

Figure 1E:
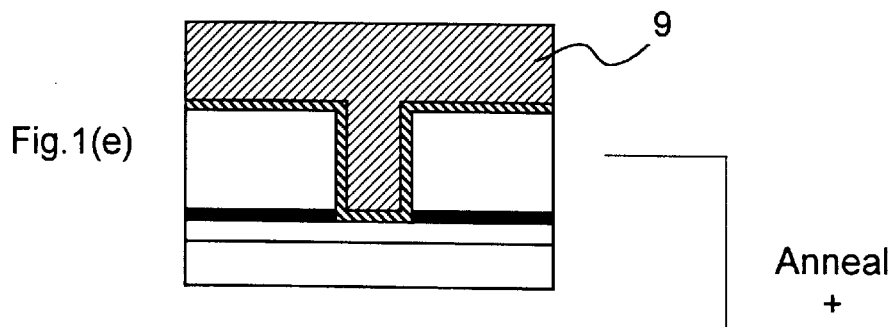
Figure 1F:
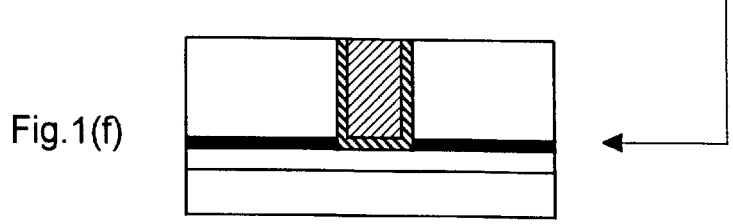

Then, a Cu plating film 9 is formed in a thickness of 800 nm by electrolytic plating or the like [FIG. 1(e)]. Annealing is conducted at a temperature of about 250 to 400° C. ° C. and then chemical mechanical polishing (CMP) is conducted until the surface of the inter-layer insulating film 4 is exposed, whereby copper can be filled in the trench as shown in FIG. 1 (f). The annealing can reduce the resistivity of Cu at 20° C. to 2 $\mu\Omega$.cm or less. The time of annealing differs depending upon the method of annealing used; it is about several tens of seconds to several minutes in, for example, RTA using a lamp and several minutes to several tens of minutes when a diffusion furnace is used.

Here, investigation was made on the effect of the nitrogen content in barrier film on film peeling.

A barrier film was formed as follows. There was used a sputtering apparatus such as shown in FIG. 3. (e.g. I-1060 using a collimator, produced by Anelva Co.); a substrate 43 having thereon an inter-layer insulating film in which a trench had been formed, was placed on an anode 42 fixed in the vacuum chamber 41 of the sputtering apparatus; the inside of the vacuum chamber 41 was purged to $3 \times 10^{-8}$ torr using a vacuum pump (not shown); Ar and $N_2$ were fed from the respective gas cylinders 48 connected to a gas inlet 46, into the vacuum chamber 41 after their flow amounts were controlled by respective mass flow controllers (MFCS) 47; separately, Ar was fed in an amount of 4 sccm (holder Ar flow amount); a Ta target (cooled by cooling water) was used as a cathode (target) 44 held by an insulator 45; a given power (herein 9 kW) was fed from a high-voltage electric source 49; thereby, Ta atoms and nitrogen atoms were reacted with each other in a discharge plasma region 50 and a tantalum nitride film was formed. The film formation rate was about 10 Å/sec. On the tantalum nitride film was formed a copper film in a thickness of 100 nm by sputtering.

Next, before or after annealing was conducted, the surface of the copper film was subjected to light scratching; a tape was applied to the scratched surface area and rapidly peeled to examine whether or not film peeling took place. The tape used was Scotch Tape (registered trade name) No. 56 (a product of Sumitomo 3M) having an adhesion strength of 558 g/cm. The standard for evaluation of film peeling, used in this peeling test was as follows.

×: Peeling took place on the whole surface.

Δ: Peeling took place partially.

○: Peeling took place slightly but the barrier film function was not impaired.

⊚: No peeling took place.

A relation between the peeling based on the above evaluation standard and the nitrogen flow amount ratio in mixed gas flow amount or the nitrogen content in barrier film is shown in the following table.

| Sample No. | Ar/N$_2$ flow amounts (N$_2$ flow amount ratio) | Nitrogen content in barrier film | Evaluation of film peeling | |
|---|---|---|---|---|
| | | | Before annealing | After annealing |
| 1 | 66/0 (0%) | 0% | ⊚ | × |
| 2 | 66/3.5 (5%) | 10% | ⊚ | × |
| 3 | 66/7 (9.9%) | 20% | ⊚ | Δ |
| 4 | 66/12 (15.4%) | 30% | ⊚ | ○ |
| 5 | 66/18 (21.4%) | 40% | ⊚ | ⊚ |
| 6 | 66/23 (25.8%) | 50% | ⊚ | ⊚ |
| 7 | 66/30 (31.8%) | 60% | ⊚ | ⊚ |
| 8 | 66/44 (40%) | 60% | ⊚ | ○ |
| 9 | 66/66 (50%) | 60% | ⊚ | Δ |

No film peeling was seen in any sample before annealing. However, annealing gave peeling between the SiOF inter-layer insulating film and the barrier film, in samples of low nitrogen content; in contrast, in samples 8 and 9 of high nitrogen content, peeling appeared between the copper film and the barrier film.

Samples were produced for evaluation of film peeling, using the same sputtering apparatus but using no collimator. Incidentally, in order to obtain the same barrier film formation rate as in the above, the power fed from the high-voltage electric source was 3 kW. The results are shown below.

| Sample No. | N$_2$ flow amount ratio | Nitrogen content in barrier film | Evaluation of film peeling | |
|---|---|---|---|---|
| | | | Before annealing | After annealing |
| 10 | 30% | 30% | ⊚ | ○ |
| 11 | 40% | 40% | ⊚ | ⊚ |
| 12 | 50% | 50% | ⊚ | ⊚ |
| 13 | 60% | 60% | ⊚ | ⊚ |

In all cases where the N$_2$ flow amount ratio was outside the above range, the film peeling evaluation after annealing was (×).

The reasons for the above are presumed to be as follows. When the nitrogen content in barrier film is low, the annealing causes (1) the fluorination of the interface by the fluorine atoms piling up on the interface and (2) the oxidation of the interface; as a result, a film of low adhesivity is formed at the interface. When the nitrogen content in barrier film is high, the copper film is nitrated by the annealing, whereby a copper nitride is formed between the copper film and the barrier film, reducing the adhesivity between the two films.

From the above, it is learned that, by forming a barrier film composed of tantalum nitride having a nitrogen content of 30 to 60%, particularly 40 to 60%, there can be formed a copper interconnect whose adhesivity,is not deteriorated by annealing. Incidentally, the nitrogen content in tantalum nitride (TaN) film was conducted by using ESCA analysis, applying an X ray to an object to be analyzed and measuring the energy (eV) and intensity (peak area) of the photo carrier emitted from the object, to determine the kind and amount of the object to be analyzed. That is, since nitrogen element show its peak at 399 eV and tantalum element shows its peak at 405 eV, the respective peak areas are calculated from a graph prepared by taking the energy of photo carrier as axis of abscissas and its intensity as axis of ordinates, a peak area ratio is calculated, and an elemental ratio is calculated therefrom. of the known tantalum nitrides, one having the highest nitrogen concentration is Ta$_3$N$_5$. The nitrogen concentration is 62.5% when calculated from the elemental ratio. Ta$_3$N$_5$ can be obtained as a red powder by red-heating tantalum chloride in an ammonia current. The tantalum nitride actually obtained by sputtering is hexagonal system TaN of high orientation or random orientation and contains nitrogen in an amount of up to 60%. The samples 7 to 9 in the former table each contain 60% of nitrogen but differ in evaluation of film peeling owing to the difference in sputtering conditions. In the samples 8 and 9, it is presumed that excessive nitrogen (other than the nitrogen as a constituent of TaN film) remains in the TaN film and this excessive nitrogen nitrates copper during annealing, which reduces the adhesivity between copper film and barrier film. In contrast, in the sample 7, it is presumed that there is substantially no residual nitrogen and no peeling appears unlike in the samples 8 and 9. Therefor, in formation of barrier film by sputtering, it is preferred to control sputtering conditions, particularly nitrogen flow amount ratio. Incidentally, any nitrogen flow amount ratio can be employed as long as the nitrogen content in tantalum nitride barrier film falls in the above range; regardless of the type of the sputtering apparatus used, it is necessary that no excessive nitrogen is fed, that is, nitrogen is fed in a necessary and sufficient amount. When argon and nitrogen are fed, it is desired that the nitrogen flow amount ratio [nitrogen flow amount/(argon flow amount+nitrogen flow amount)] is about 15 to 40%, preferably about 20 to 30% when a collimator is used and about 30 to 60%, preferably about 40 to 60% when no collimator is used.

The thickness of the barrier film is desirably 5 nm or more. When the thickness is less than 5 nm, the barrier film has no sufficient barrier property. Meanwhile, when the thickness is large, peeling may occur from the middle of copper film formation, between the SiOF inter-layer insulating film and the barrier film because the direction of the inside stress of barrier film and the direction of the inside stress of copper film are opposite. This peeling tendency is stronger when the nitrogen content in barrier film is higher, because a higher nitrogen content makes the barrier film harder and makes stress relaxation difficult. Therefore, the upper limit of barrier film thickness is desirably about 60 nm although it differs depending upon the nitrogen content in barrier film.

As to the thickness of the copper sputtering film, there is no particular restriction as long as the film can become a uniform seed layer for copper plating film. The thickness of the copper sputtering film is about 50 to 200 nm, preferably about 75 to 150 nm.

In the present invention, the above-mentioned gas system was used in formation of a SiOF inter-layer insulating film. However, the gases used are not restricted to the above.

Next, description is made on other embodiment of the present invention, with reference to,FIGS. 2(a) to 2(g).

FIGS. 2(a) to 2(g) are sectional views showing the steps of second embodiment of the present invention, wherein a copper contact and a copper interconnect are simultaneously formed in an inter-layer insulating film formed in two successive layers, so as to form a dual damascene structure.

Figure 2A:
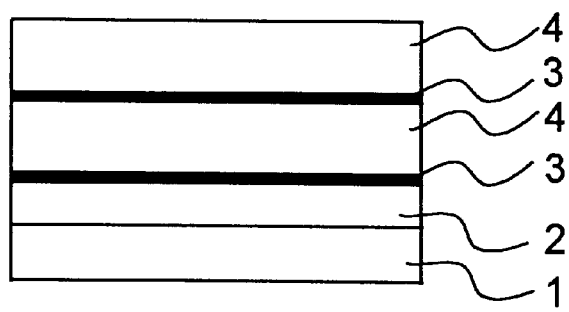
FIGS. 2(a) to 2(g) are sectional views showing the steps of other embodiment of the method of the present invention.

First, as shown in FIG. 2(a), a $SiO_2$ insulating film 2 is formed on a silicon substrate 1 wherein a transistor region (not shown) and a contact (not shown) have been formed, after which an etching stopper film 3 composed of SiN, SiON or the like is formed in a thickness of about 50 nm. Thereafter, an inter-layer insulating film 4 composed of SiOF (a trench for filling copper is formed therein later) is formed in a thickness of about 400 nm. Further, an etching stopper film 3 and an inter-layer insulating film 4 are formed in this order.

Figure 2B:
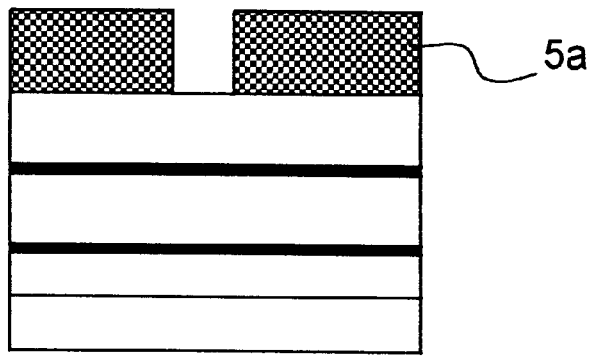
Figure 2C:
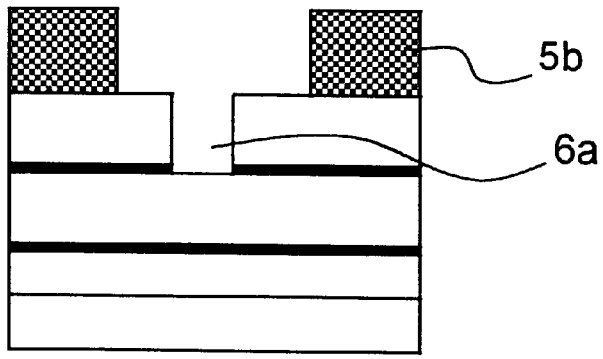
Figure 2D:
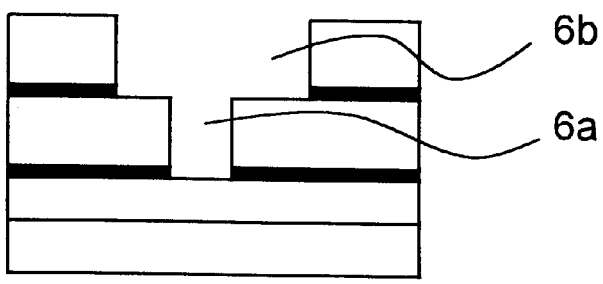
Figure 2E:
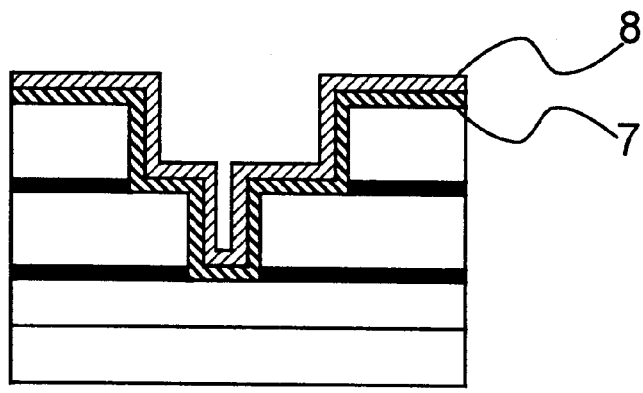
Figure 2F:
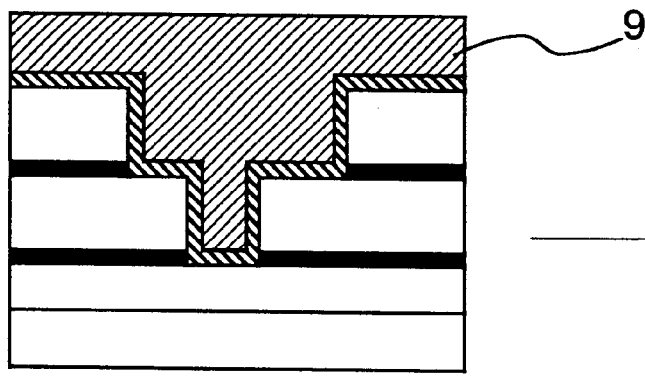

Next, a resist mask 5a corresponding to a contact pattern is formed [FIG. 2(b)]. Using this mask, the upper inter-layer insulating film 4 and the etching stopper film 3 are etched to form a contact via 6a. A resist mask 5b corresponding to an interconnect trench pattern is formed [FIG. 2(c)]. Then, the lower inter-layer insulating film 4 exposed at the bottom of the contact via 6a and the upper inter-layer insulating film 4 are etched simultaneously, whereby is formed a structure having a contact via 6a and interconnect trench 6b, such as shown in FIG. 2(d).

Figure 2G:
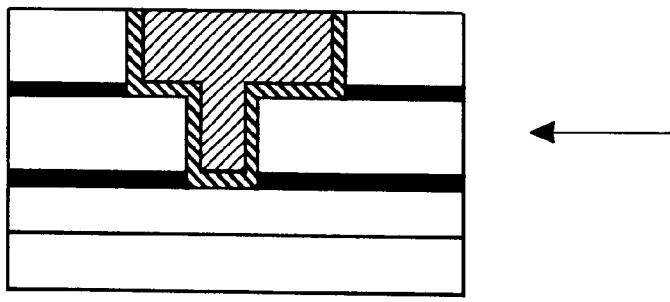

Thereon are formed a 30-nm barrier film 7 composed of TaN (nitrogen content: 50%) and a 100-nm Cu sputtering film 8 in the same manner as mentioned above [FIG. 2(e)]. Further, in the same manner, a Cu plating film 9 of about 1 µm in thickness is formed [FIG. 2(f)]. Then, annealing of 400° C. is conducted, after which CMP is conducted until the surface of the upper inter-layer insulating film is exposed. Thus, a buried interconnect of dual damascene structure such as shown in FIG. 2(g) can be formed.

The present invention is not restricted to single-layer interconnect such as shown above and can be applied also to multi-layer interconnect.

What is claimed is:

1. A semiconductor device having a copper interconnect filled in a trench of an inter-layer insulating film composed of at least SiOF, via a barrier film, wherein the barrier film is composed of tantalum nitride containing 30 to 60% of nitrogen.

2. A semiconductor device according to claim 1, wherein the nitrogen content of the barrier film is 40 to 60%.

3. A semiconductor device according to claim 1, wherein the barrier film has a thickness of 5 to 60 nm.

4. A semiconductor device according to claim 2, wherein the barrier film has a thickness of 5 to 60 nm.

5. A semiconductor device according to claim 1, wherein the copper interconnect has a resistivity of 2 $\mu\Omega$.cm or less at 20°C.

6. A semiconductor device according to claim 2, wherein the copper interconnect has a resistivity of 2 $\mu\Omega$.cm or less at 20° C.

7. A semiconductor device according to claim 3, wherein the copper interconnect has a resistivity of 2 $\mu\Omega$.cm or less at 20° C.

8. A semiconductor device according to claim 4, wherein the copper interconnect has a resistivity of 2 $\mu\Omega$.cm or less at 20° C.

* * * * *